United States Patent [19]

Isaka et al.

[11] Patent Number: 5,124,967
[45] Date of Patent: Jun. 23, 1992

[54] AUTOMATIC GAIN CONTROL METHOD AND APPARATUS IN OPTICAL DISK SYSTEM

[75] Inventors: Kazuo Isaka, Odawara; Kazuo Shigematsu, Saitama; Osami Kushizaki, Hiratsuka; Masahiro Takasago; Takuya Mizokami, both of Odawara, all of Japan

[73] Assignee: Hitachi, Ltd., Tokyo, Japan

[21] Appl. No.: 547,841

[22] Filed: Jul. 3, 1990

[30] Foreign Application Priority Data

Jul. 6, 1989 [JP] Japan ................................. 1-173052

[51] Int. Cl.$^5$ .............................................. G11B 5/09
[52] U.S. Cl. .................................. 369/48; 369/44.36; 369/54; 369/44.35; 369/43; 369/111
[58] Field of Search ............... 369/48, 54, 43, 44.36, 369/44.35, 44.29, 44.31, 44.32, 44.33, 61, 49, 50, 51, 111, 133, 174, 106; 360/67, 77.01, 77.03, 77.08

[56] References Cited

U.S. PATENT DOCUMENTS 4,580,255 4/1986 Inoue et al. .................... 369/44.37
4,890,273 12/1989 Takeuchi et al. ............. 369/44.3 C

FOREIGN PATENT DOCUMENTS

60-115073 6/1985 Japan .

Primary Examiner—Roy N. Envall, Jr.
Assistant Examiner—Robert Chevalier
Attorney, Agent, or Firm—Kenyon & Kenyon

[57] ABSTRACT

An amplitude difference between a reproduction signal from a preformat portion of an optical disk and a reproduction signal from a recording portion of user's data is obtained. When the amplitude difference exceeds a predetermined value, a first gain value which was set for information from the preformat portion is used as a gain value of an AGC circuit for reproduction and a gain control of the reproduction signal is performed. On the other hand, when the amplitude difference is smaller than the predetermined value, a second gain value which was set for the user's data is used. Thus, a situation such that a noise and a remaining signal of the user's data which was not erased are erroneously recognized as an inherent reproduction signal can be prevented. A discrimination to see if the data has been recorded in the recording portion of the user's data or not can be also accurately performed.

13 Claims, 3 Drawing Sheets

(0dB IS SELECTED WHEN EACH CONTROL BIT IS SET TO THE L LEVEL)

AUTOMATIC GAIN CONTROL METHOD AND APPARATUS IN OPTICAL DISK SYSTEM

BACKGROUND OF THE INVENTION

The present invention relates to an automatic gain control method and apparatus in an optical disk system and, more particularly, to automatic gain control method and apparatus which can discriminate whether a data has been recorded in a certain area on an optical disk to record user's data or not.

Generally, in the optical disk system, a number of tracks are formed on an optical disk, each track is divided into a plurality of sectors, and information is recorded or reproduced on a sector unit basis. Each sector has a preformat portion in which control information such as identification (ID) and the like has previously been recorded and an information recording portion to record user's data.

Hitherto, as an optical disk apparatus having a function to discriminate whether a data has correctly been recorded in the information recording portion or not, for instance, there has been known a technique disclosed in JP-A-60-115073. According to such a technique, an envelope of a reproduction signal of the optical disk is detected, the level of the envelope signal is compared with a reference potential, a time duration of a period when the envelope signal level is deviated from the reference potential is counted, and when the time duration is shorter than the reference time duration it is determined that the data has correctly been recorded.

According to the above conventional technique, no consideration is made with respect to the signal-to-noise (S/N) ratio of the information signal and there is a problem such that even if a good S/N ratio is obtained, the signal in which the absolute level of the amplitude is small cannot be recognized as data.

That is, in the above conventional technique, since it is considered that the fluctuation in amplitude itself indicates the data quality, there can occur a case where in spite of the fact that the S/N ratio is enough high, when the absolute amplitude of the signal S is merely small, it is determined that the data quality is bad, that is, the data is not normal. As such a case, for instance, there can be mentioned a case where in spite of the fact that the recording state of the user's data for the magnetooptic disk is good, although the S/N ratio is high, the signal level S decreases due to a deterioration in sensitivity of the disk by an ambient temperature, a reflectance of the disk, a deterioration in light source upon reproduction, and a variation in efficiency of a photodetector, or the like. In such a case, in the conventional technique, the data guality which is higher than it is needed is guaranteed.

On the other hand, generally, in the optical disk recording and reproducing apparatus, an automatic gain control method whereby an amplitude fluctuation of the reproduction signal is compensated to make the amplitude constant has conventionally been well known. However, in this case, as the reproduction signal amplitude (level) decreases, a gain of an amplifier of the gain controller is increased. Thus, there is a problem such that the noise whose amplitude (level) is small and the remaining signal component which was not erased when erasing the recorded data are also enhanced to predetermined levels and they are erroneously recognized as signals.

SUMMARY OF THE INVENTION

It is an object of the present invention to provide an optical information reproducing method and apparatus in which an amplitude of an information reproduction signal is made constant and the quality of the reproduction signal can be assured.

Another object of the present invention is to prevent the noise and the remaining signal which are not erased when erasing the recorded data from being erroneously recognized as an inherent reproduction signal.

Still another object of the present invention is to provide an automatic gain control method and apparatus which can accurately recognize whether a data has already been recorded in an area to record user's data or not.

According to one feature of the present invention, when an amplitude difference between a reproduction signal of information which has previously been recorded in an optical medium and a reproduction signal of information which was newly recorded is equal to or less than a predetermined value, that is, when the amplitude of the newly recorded information is not extremely smaller than the amplitude of the information which has previously been recorded, a second control value to control a gain of a variable gain amplifier is used. The second control value increases as the reproduction signal amplitude of the newly recorded information decreases. Even when the reproduction signal amplitude of the newly recorded information slightly decreased, the gain of the variable gain amplifier increases in accordance with the reproduction amplitude reduction and an output of the variable gain amplifier can be made constant. Therefore, even for a reproduction signal of a small amplitude, if the S/N ratio does not deteriorate, the quality can be assured. On the other hand, when the reproduction levels of both of the previously recorded information and the newly recorded information decreased due to a deterioration in intensity of the light source upon reproduction, a variation of the photodetector, or the like, the amplitude difference is maintained within a predetermined value range. Therefore, the output is similarly made constant and the quality of the reproduction signal can be assured.

On the other hand, when the amplitude difference between the reproduction signals of the two kinds of information exceeds the predetermined value range, that is, when the amplitude of the newly recorded information is extremely smaller than the amplitude of the previously recorded information or the like, for instance, when an information unrecorded portion or a remaining signal which was not erased still exists or when a dust is adhered onto the disk or the like, the first control value is used. Since the reproduction level of the previously recorded information such as an ID and the like is sufficiently higher than the reproduction level of the newly recorded information, the first control value is sufficiently smaller than the second control value, so that the gain of the variable gain amplifier is suppressed to an extremely small value. Thus, a situation such that the noise and the remaining signal component which was not erased are erroneously recognized as an inherent signal or that the unrecorded portion is erroneously recognized as a recording portion does not occur.

On the other hand, as mentioned above, the first control value increases as the reproduction amplitude of the previously recorded information decreases, while the second control value increases as the reproduction amplitude of the newly recorded information decreases. Therefore, the amplitude difference between the previously recorded information and the newly recorded information corresponds to the difference between the first and second control values and can be discriminated by checking the difference between the first and second control values.

More practically speaking, an automatic gain control apparatus of an optical disk apparatus according to the invention comprises: first gain control means for controlling a gain of a variable gain amplifier for an information signal which has previously been recorded, for instance, a reproduction signal from a preformat portion of an ID and the like and for setting an amplitude of an output signal of the variable gain amplifier to a predetermined value; a first memory circuit to store a control value which gives the predetermined amplitude as a first control value; second gain control means for controlling the gain of the variable gain amplifier for information which was newly recorded, for instance, a reproduction signal from an area to record user's data and for setting an amplitude of an output signal of the variable gain amplifier to a predetermined value; a second memory circuit to store a control value which gives the predetermined amplitude as a second control value; discriminating means for discriminating whether an amplitude difference between the reproduction signal of the previously recorded information and the reproduction signal of the newly recorded information is equal to or smaller than a predetermined value or not; and control value setting means which is constructed in a manner such that when the newly recorded information is reproduced later; the control value of the variable gain amplifier is set on the basis of the second control value (for instance, the control value is set to the second control value itself) when it is determined that the amplitude difference is equal to or smaller than the predetermined value and that the control value of the variable gain amplifier is set on the basis of the first control value (for instance, the control value is set to the first control value itself) when it is determined that the amplitude difference exceeds the predetermined value.

The discriminating means can be also constructed so as to compare the first and second control values which were stored and to thereby discriminate whether the difference therebetween is equal to or smaller than a predetermined value or not.

On the other hand, in another preferred embodiment, the first and second gain control means can be also constructed by one common gain controller. Further, the first and second memory circuits are respectively constructed by, for instance, latch circuits. As a possible modification, those two memory circuits may be also constructed as a single memory.

According to the invention, when the amplitude difference between the reproduction signal of the previously recorded information and the reproduction signal of the newly recorded information is equal to or smaller than a predetermined value, the control value (the first control value) to set the amplifier output amplitude for the previously recorded information to a predetermined value is used as a gain control value of the variable gain amplifier for reproduction, and when the reproduction amplitude difference is out of the predetermined value, the control value (the second control value) to set the amplifier output amplitude for the newly recorded information to a predetermined value is used as the gain control value. Therefore, when the reproduction signal amplitude of the newly recorded information is fairly large, even if the reproduction signal amplitude of the newly recorded information was slightly reduced due to a variation of the photodetector or the like, the predetermined output amplitude is obtained and the quality can be assured.

DESCRIPTION OF THE PREFERRED EMBODIMENTS

An embodiment of the present invention will be described hereinbelow with reference to the drawings.

Figure 1:
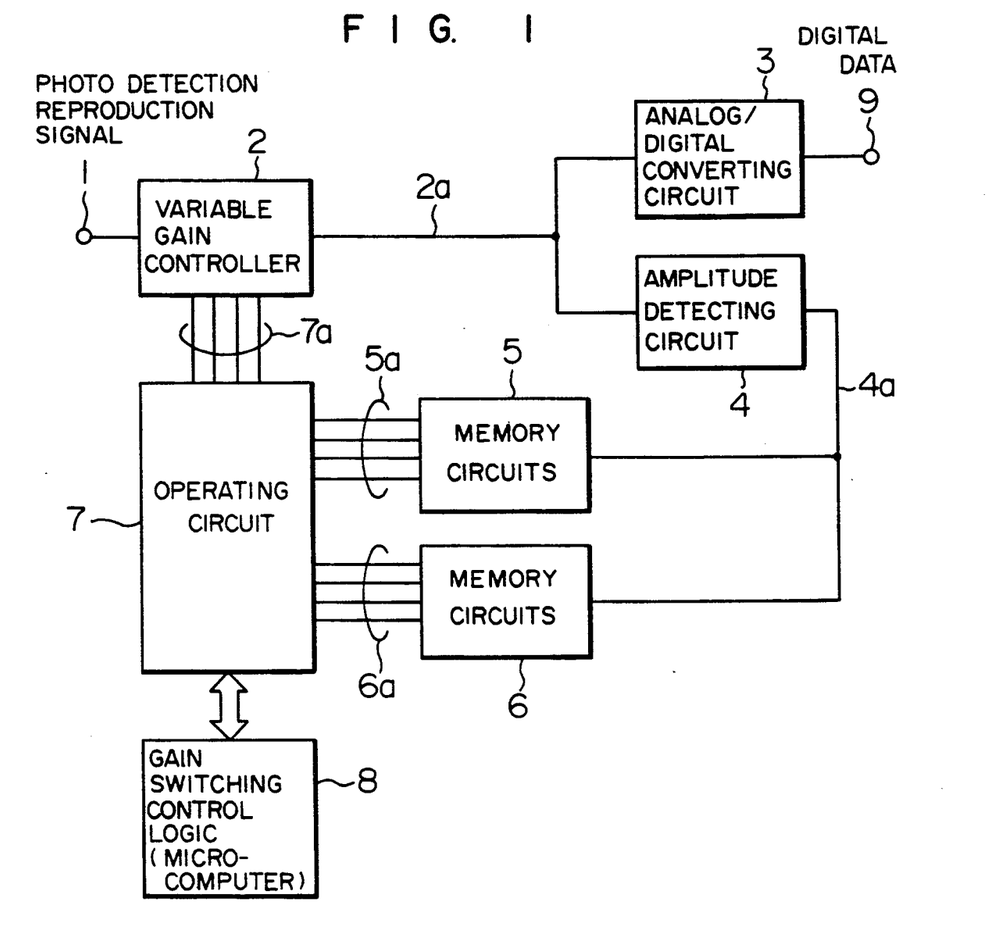
FIG. 1 is a block diagram showing an automatic gain control apparatus according to an embodiment of the present invention.

FIG. 1 shows a block diagram illustrating a construction of an embodiment. FIGS. 2A-2E show waveform diagrams for explaining the operation of FIG. 1.

In FIGS. 1 and 2A-2E, a reference numeral 1 denotes a light detection reproduction signal; 2 indicates a variable gain controller (AGC circuit); 2a an output signal of the AGC circuit 2; 3 an analog/digital (A/D) converter; 4 an amplitude detecting circuit; 5 a first memory circuit such as a latch circuit; 5a a first control value; 6 a second memory circuit such as a latch circuit; 6a a second control value; 7 an operating circuit; 7a a gain control value; 8 a control logic circuit using, for instance, a microcomputer; and 9 a digital data output.

Figure 3:
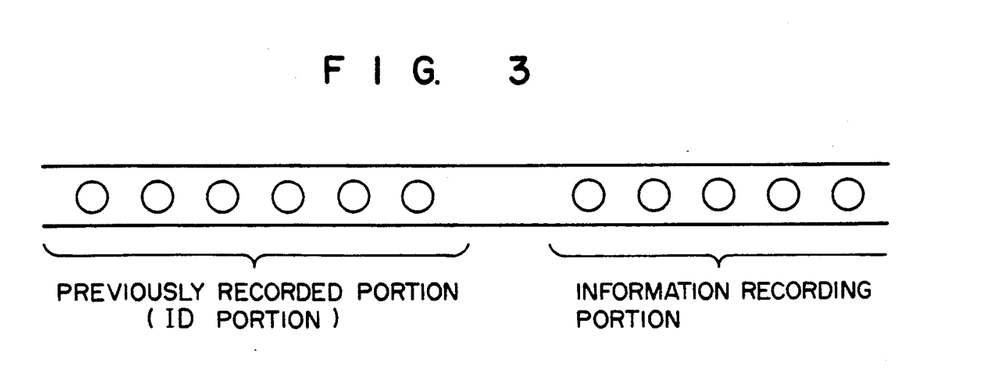
FIG. 3 is a diagram showing a format of a prepit portion of an optical disk.

FIG. 3 shows a sector construction on a track of an optical disk. Generally, in an optical disk which is specified by the ISO (International Standard Organization), one track is divided into a plurality of sectors and each sector is constructed such that an ID portion (for example, six byte length) and a data recording portion are continuously arranged after a sector mark. As shown in the diagram, the ID portion is also called a prepit portion or a preformat portion and is a portion in which control information has previously been recorded. The subsequent information recording portion is a recording portion to, for instance, magnetooptically record user's data. The recording portion of the optical disk is preliminarily magnetized and data is recorded into the magnetized information recording portion by irradiating a laser beam thereto. The ID portion is a portion in which necessary control information such as addresses, sync information, and the like has previously been recorded by physically forming pits (namely, holes) into the optical disk. In the ID portion, a change in light quality of the reflected lights from the pits which are obtained when a light was irradiated onto the optical disk is used as a photo detection signal 1. That is, light quality changes due to the presence or absence of the pits in the ID portion and the signal 1 including the control information is reproduced.

In the case of a magnetooptic disk, in the magnetooptic recording portion, when the light was irradiated onto the optical disk, a rotation amount of the light due to the Kerr rotation by the Kerr effect is detected and used as a photo detection signal 1. Ordinarily, since a sector mark exists before the ID portion, the ID portion is detected after the elapse of a time $T_1$ (FIGS. 2A-2E) from the detection of the sector mark and the area of the information recording portion is detected after the elapse of time $T_2$.

Figure 4:
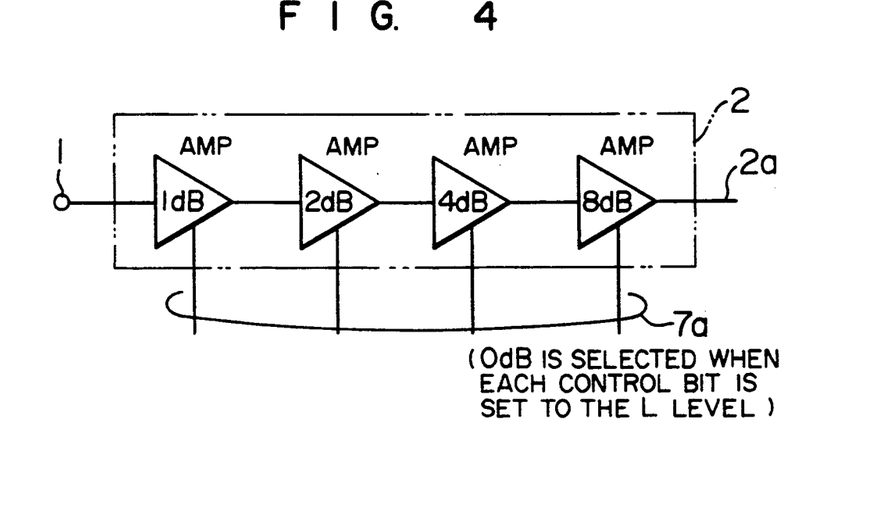
FIG. 4 is a diagram showing an example of a variable gain controller (AGC circuit)

In FIG. 1, the photo detection signal 1 is inputted to the AGC circuit 2 and is amplified in accordance with the gain control value 7a. As shown in a practical example of the AGC circuit 2 in FIG. 4, the AGC circuit 2 can increase the gain every dB by 16 steps from 0 dB to 15 dB in accordance with the control value 7a of, e.g., four bits.

It is now assumed that the gain control value 7a was first set to the lowest limit value by the operating circuit 7 at time $T_1$, so that the gain of the AGC circuit 2 was set to the lowest value (e.g., 0 dB). Then, the operating circuit 7 increases the gain control value 7a one step by one at predetermined period (for instance, one-bit period of the reproduction signal 2). Thus, the gain of the AGC circuit 2 is increased one dB by one and the output signal 2a shown in FIG. 2B is obtained from the AGC circuit 2. When the output signal 2a has reached a predetermined amplitude, such a state is detected by the amplitude detecting circuit 4.

Figure 5A:
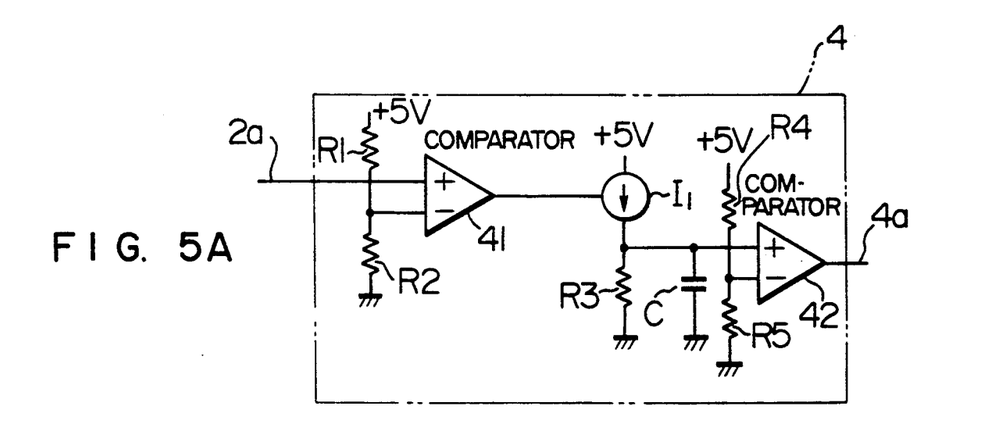
FIGS. 5A and 5B are a diagram showing an example of an amplitude detecting circuit and a waveform of an AGC output signal, respectively.
Figure 5B:
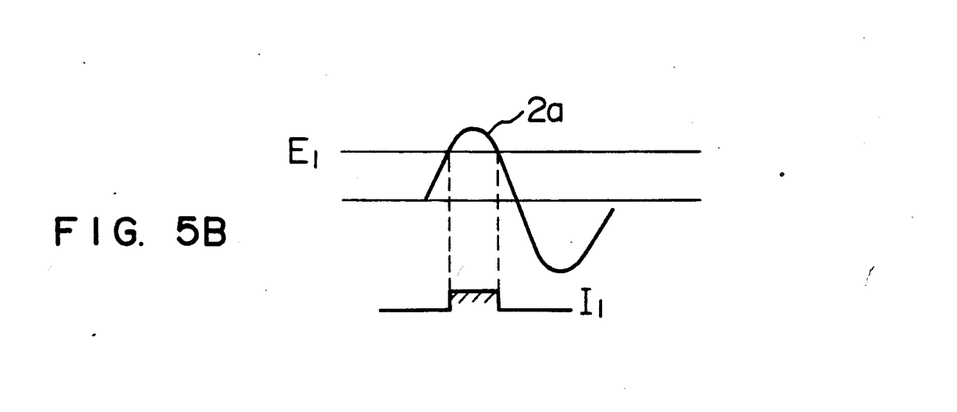

FIG. 5A shows a practical example of the amplitude detecting circuit 4. In the Figure, the output signal 2a of the AGC circuit 2 is compared with a predetermined voltage $E_1$ which is divided by resistors $R_1$ and $R_2$. As shown in FIG. 5B, when the level of the AGC output signal 2a is smaller than the predetermined voltage $E_1$, an output of a comparator 41 is set to the low level and a constant current circuit $I_1$ is turned off. Since a voltage level of a +side input of a comparator 42 is lower than a voltage which is divided by resistors $R_4$ and $R_5$, an output 4a of the comparator 42 (namely, an output of the amplitude detecting circuit 4) is set to the low level. When the level of the AGC output signal 2a is larger than the predetermined voltage which is divided by the resistors $R_1$ and $R_2$, the output of the comparator 41 is set to the high level, the constant current circuit $I_1$ is turned on, a capacitor C is charged, and the level of the + side input of the comparator 42 is larger than the −side voltage. Thus, the output 4a of the comparator 42 (i.e., the output of the amplitude detecting circuit 4) is set to the high level. By properly selecting the value of the capacitor C, when the AGC output signal 2a is set to a predetermined amplitude, the output 4a of the comparator 42 can be set to the high level.

When the fact that the output signal 2a has reached the predetermined amplitude is detected by the amplitude detecting circuit 4 as mentioned above, the first memory circuit 5 and the operating circuit 7 are made operative by the detection signal, namely, the output 4a of the amplitude detecting circuit 4. The gain control value 7a at that time is stored as a first control value 5a into the first memory circuit 5. After that, while the information is reproduced from the ID portion, by using the stored first control value 5a as a gain control value 7a, the gain of the AGC circuit 2 is controlled to a desired gain, so that the output signal 2a of a predetermined amplitude is derived. That is, the envelope of the reproduction signal 2a from the ID portion is maintained to a predetermined level.

Subsequent to the reproduction of the information from the ID portion, the newly recorded information, namely, the newly recorded user's data is read out of the information recording portion after time $T_2$. At this time (at time $T_2$), the gain control value 7a is separated from the first control value 5a, the gain control value 7a is similarly set to the lowest limit value, and the gain of the AGC circuit 2 is set to the lowest value (for example, 0 dB). After that, the gain control value 7a is increased by one step at a predetermined period (e.g., one-bit period) and the gain of the AGC circuit 2 is increased one dB by one. When the amplitude of the output signal 2a increases and reaches a predetermined amplitude, the amplitude detecting circuit 4 generates the detection output signal 4a in a manner similar to the above. The second memory circuit 6 and the operating circuit 7 are made operative by the detection signal 4a and the gain control value 7a at that time is stored as a second control value 6a into the second memory circuit 6. In the ordinary case, in other words, when the difference between the first and second control values lies within a predetermined value range, for instance, as will be explained hereinlater, the second control value 6a is used as a gain control value 7a to control the gain of the AGC circuit 2 while the information is being reproduced from the subsequent information recording portion, so that the output signal 2a of a predetermined amplitude is derived. That is, the envelope of the reproduction signal 2a of the information recording section which was newly recorded is maintained to a predetermined level.

Subsequent to the storage of the second control value 6a, until a time $T_3$ (a time which is set in a predetermined time after the sector mark was detected), the difference between the first and second control values 5a and 6a is calculated by the operating circuit 7. The operating circuit 7 detects the difference between the first gain control value 5a to set the amplitude of the reproduction signal, i.e., signal 2a of the ID portion having relatively high reliability to a predetermined value and the second gain control value 6a to set the amplitude of the reproduction signal of the information recording portion whose S/N ratio is lower than that of the ID portion to a predetermined value. The difference between the control values 5a and 6a corresponds to the difference between the photo detection reproduction signal 1 from the ID portion and the signal 1 from the information recording portion. In order to discriminate whether the difference between the first and second control values 5a and 6a lies within a predetermined range or not, the difference is transferred to the gain switching control logic circuit 8 comprising, for instance, a microcomputer, if it is determined by the discriminating circuit in the control logic circuit 8 that the difference lies within the predetermined range, that is, when the reproduction level of the data recorded in the information recording portion is not extremely lower than the photo detection signal level of the ID portion, the second control value 6a is set as it is as a gain control value 7a at time $T_3$ and is used after that. For example, the case where the photo detection signal level of the ID portion is larger than the signal level of the information recording portion by 2 dB will now be considered. Now, assuming that the first gain control value 5a is set to "4", the second gain control value 6a is set to "6". For instance, when a condition such that ($|6a-5a|2$) is set, since the condition is now satisfied, the second gain control value 6a (the value of "6") is directly used as a control value 7a and the reproduction signal is set to a predetermined amplitude.

Figure 2A:
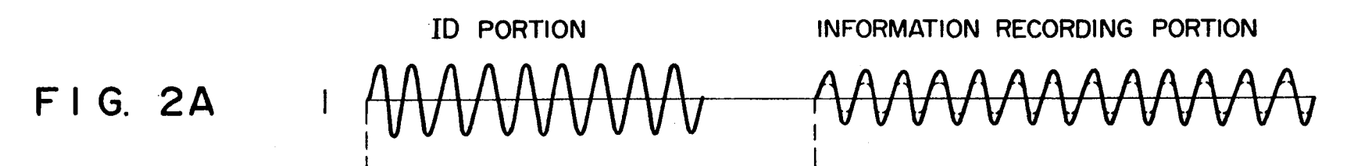
FIGS. 2A to 2E are timing charts for explaining the operation of the apparatus of FIG. 1.
Figure 2B:
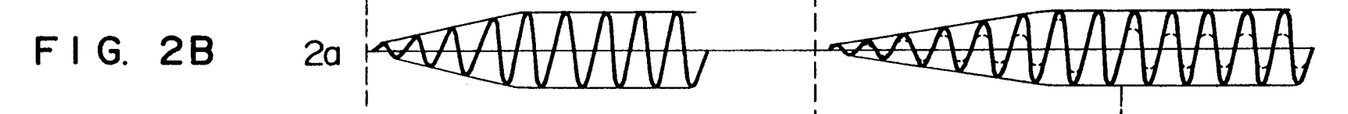
Figures 2C, 2D:
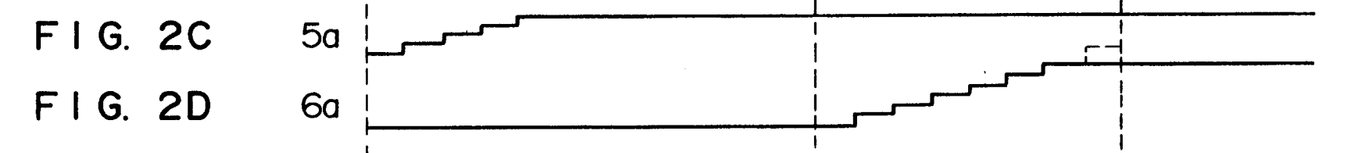
Figure 2E:
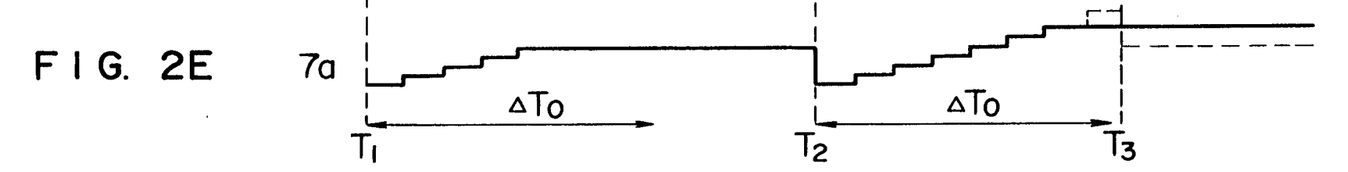

On the other hand, as shown by broken lines in FIG. 2A, when the amplitude of the reproduction signal 1 of the information recording portion remarkably decreased, the result of the discrimination of the control logic circuit 8 indicates that the difference is out of the predetermined range (that is, the above condition is not satisfied). As shown by broken lines in FIG. 2E, the gain control value 7a is switched from the second control value 6a to the first control value 5a at time $T_3$ by the control logic circuit 8 and is set. For instance, when the photo detection signal of the ID portion is larger than the signal of the information recording portion by 3 dB, $|6a-5a|=3$, so that the difference is out of the predetermined range in the above condition. Therefore, in such a case, the value "4" as a first control value 5a is used as a control value 7a. Thus, it is avoided that the gain of the AGC circuit 2 unnecessarily increases and it is prevented that the amplitude of the output signal 2a unnecessarily increases.

In the invention, for instance, the following three methods are considered as a method where the photo detection reproduction signal 1 is outputted from the ID portion and the information recording portion and the AGC is executed to the photo detection reproduction signal 1. The first method relates to the case of what is called a "Read After Write" in which after data was recorded into the information recording portion, it is regenerated to check the recording quality of the data. The second method relates to the case of what is called "Read After Erase" in which after data was erased, the erasing quality is checked. The third method relates to the case of ordinary "Read". In the ordinary "Read", there are obviously a case where data whose recording quality was checked exists in the information recording portion (magnetooptic recording portion) and a case where the erasing quality is checked and no data exists and an optical disk noise, a remaining noise which was not erased when erasing the data, and the like merely exist as a photo detection reproduction signal.

As mentioned above, in the ordinary case, that is, in the case where data is normally recorded in the information recording portion, i.e., in the magnetooptic recording portion and the reproduction amplitude of the data is not so largely low as compared with the reproduction amplitude of the ID portion, the gain of the AGC circuit 2 is controlled by using the second control value 6a such that the photo detection reproduction signal from the newly recorded portion (data portion of the information recording portion) is set to a predetermined amplitude after time $T_3$. Therefore, the input (output 2a of the AGC circuit) of the A/D converting circuit 3 which is connected to the AGC circuit 2 becomes stable. The saturation of the circuit due to an excessive amplitude and the influence by the offset voltage due to the too small amplitude are eliminated. The deterioration of the data quality can be prevented.

On the other hand, generally, in the unrecorded case such as case where the magnetooptic recording portion (information recording portion) of the rewritable type optical disk is not recorded, case where the data was erased as mentioned above, case where an intensity (light emission amount of the laser) of the light beam when new data is written into the magnetooptic recording portion remarkably decreased due to some reasons (life and the like) and the data of the necessary lowest limit level could not be written (for instance, failed), or the like, the noise of the unrecorded portion is amplified after time $T_2$. Thus, the second control value 6a reaches a value near the highest limit value (broken line in FIG. 2D). The difference between the second control value 6a and the first control value 5a as a gain control value of the ID portion increases. Thus, the control value 7a is set to the first control value 5a at time $T_3$. Therefore, since the gain of the AGC circuit 2 corresponding to the unrecorded portion is suppressed to a lower value (than the value when the second control value 6a is used as it is), the noise of the magnetooptic recording portion and the level of the remaining signal which was not erased are also suppressed to enough low values and are not erroneously recognized as the normal signal data. That is, the case where the data has normally been recorded and the case where data is not recorded can be clearly distinguished. The case where a data is not recorded can be considered to be the case where the photo detection reproduction signal 1 shown by the broken line in FIG. 2A, extremely decreases. Therefore, the second control value 6a extremely increases and the value of $|6a-5a|$ remarkably increases. However, since the gain control value 7a is eventually set to 5a instead of 6a, the noise is not amplified and no data is transmitted, so that such a case is determined to be the unrecorded portion.

The series of gain control operations mentioned above are repeated every sector constructing the track of the optical disk. That is, whenever the sector mark is detected, the gain control value 7a is initialized to the lowest value and the above operations are executed from that timing.

Although an embodiment of the present invention has been described above, the invention is not limited to the above embodiment, but many variations and modifications of the invention are possible.

For instance, in the above embodiment, as a gain control value 7a of the amplifier (AGC circuit) 2 for the portion which was newly recorded at time $T_3$, either one of the control values 5a and 6a stored at that time is used.

Therefore, there is also considered a modification of such a case. That is, as gain control values 5a and 6a (particularly, 6a) which are stored, a plurality of control values before them (for instance, regarding a few sectors) are previously obtained and the average value or intermediate value of those control values is used or the like (preferably, a function of the gain control value for the reproduction signal of the previous information is used), so that the quality guarantee can be also improved for a detect and the like of the disk. By using the above method, the unrecorded portion can also be further easily detected.

On the other hand, the average level of the ID portion in one sector is detected and a desired gain control value corresponding to the average value can be also set to the first control value.

As further another modification, the memory circuits 5 and 6 in the above embodiment can be also physically constructed by one memory.

On the other hand, although the above embodiment has been described with respect to the reproduction of the information from each sector of the rewritable type optical disk, for instance, magnetooptic disk or the gain control, the invention can be also applied to an unrewritable type optical disk, for instance, write once type optical disk to which information can be written once.

Further, the invention is not limited to the optical disk apparatus but can be also applied to other apparatus for optically recording and reproducing information, for instance, an optical card apparatus or the like.

What is claimed is:

1. A gain control apparatus of a variable gain amplifier in a system for optically reproducing information recorded on a recording medium, comprising:

first gain control means for controlling a gain of a variable gain amplifier on the basis of a first gain control value for a reproduction signal of the information which has previously been recorded on the recording medium to set an amplitude of an output signal constant;

second gain control means for controlling the gain of the variable gain amplifier on the basis of a second control value for a reproduction signal of information which was recorded later to set an amplitude of an output signal constant;

discriminating means for discriminating whether an amplitude difference between the reproduction signal of the previously recorded information and the reproduction signal of the information which was recorded later is equal to or smaller than a predetermined value or not; and control value setting means responsive to reproduction of the information which was recorded later, for setting a control value of the variable gain amplifier on the basis of the second control value when it is determined that the amplitude difference is smaller than the predetermined value and setting the control value of the variable gain amplifier on the basis of the first control value when it is determined that the amplitude difference exceeds the predetermined value.

2. A gain control apparatus according to claim 1, wherein said discriminating means includes comparing means for comparing the first control value and the second control value and discriminates whether the difference obtained as a result of the comparison is equal to or smaller than a predetermined value or not.

3. A gain control apparatus according to claim 1, further comprising memory means for storing said first control value and said second control value, and wherein said discriminating means compares the first and second control values read out of said memory means.

4. A gain control method in optically reproducing information recorded on a recording medium, comprising the steps of:

optically detecting the information recorded in at least first and second areas of said recording medium;

controlling a gain of a variable gain amplifier on the basis of a first gain value for a first signal which is obtained from the first area to set an amplitude of an output signal constant;

controlling the gain of the variable gain amplifier on the basis of a second gain value for a second signal which is obtained from the second area in order to set an amplitude of an output signal constant;

discriminating whether a difference between the amplitudes of the first and second signals is smaller than a predetermined value or not; and in reproduction of the second signal, setting said second gain value as a gain value of the variable gain amplifier when it is determined as a result of the discrimination that the amplitude difference is smaller than the predetermined value and setting the first gain value as a gain value of the variable gain amplifier when it is determined that the amplitude difference is out of the predetermined value.

5. A method according to claim 4, wherein a plurality of tracks are formed on said recording medium, said first and second areas are arranged in the direction of a track, and the information of said second area is reproduced subsequently to the information from said first area.

6. A method according to claim 4, further comprising the steps of:

sequentially changing the gain value until the output signal of the variable gain amplifier is set to a predetermined amplitude for a period of time when the signal is obtained from the first area;

setting the gain value when the output signal was set to the predetermined amplitude, as a first gain value;

sequentially changing the gain value until the output signal of the variable gain amplifier is set to a predetermined amplitude for a period of time when the signal is obtained from the second area; and setting the gain value when the output signal was set to the predetermined amplitude, as a second gain value.

7. A method according to claim 6, further comprising the step of temporarily storing the first and second set gain values into memories.

8. A method according to claim 5, wherein said discriminating step is executed for a period of time when the signal is being reproduced from the second area.

9. A method according to claim 4, wherein the switching to set either one of the first and second gain values is performed by a control of a microcomputer.

10. A method of recording or reproducing user's data onto/from an optical disk on which a plurality of tracks are defined and in which each track is divided into a plurality of sectors and each sector has a preformat portion in which at least control information for recording or reproduction has previously been recorded and a recording portion to record the user's data, comprising the steps of:

obtaining a signal for reproduction from each track by optical irradiation;

controlling a gain of a variable gain amplifier until an output signal of the variable gain amplifier is set to a predetermined amplitude for a signal from the preformat portion;

storing the gain when the output signal was set to the predetermined amplitude as a first gain value.

controlling the gain of the variable gain amplifier until the output signal of the variable gain amplifier is set to a predetermined amplitude for a signal obtained from the recording portion of the user's data;

storing the gain when the output signal was set to the predetermined amplitude as a second gain value;

discriminating whether a difference between the amplitudes of the signal which is reproduced from the preformat portion and the signal which is reproduced from the recording portion of the user's data satisfies a predetermined relation or not;

setting the gain of the variable gain amplifier on the basis of the second gain value when the amplitude difference satisfies the predetermined relation as a result of the discrimination by the discriminating step and setting the gain of the variable gain amplifier on the basis of the first gain value when the amplitude difference does not satisfy said predetermined relation; and controlling the gain of the variable gain amplifier in accordance with the first and second set gain values and obtaining the signal which is reproduced from at least the recording portion of the user's data.

11. A method according to claim 10, wherein among the plurality of sectors, the user's data has already been recorded in the recording portion of a certain sector and the user's data is not recorded yet in the recording portion of the other certain sector.

12. A method according to claim 11, wherein the step of controlling the variable gain amplifier in accordance with the first or second gain value is executed in the case where user's data in newly optically recorded into the recording portion and, thereafter, the recorded user's data is reproduced from the recording portion in order to discriminate whether the data has correctly been recorded or not.

13. A method according to claim 11, wherein the optical disk is a disk in which the recorded user's data can be erased and the step of controlling the variable gain amplifier in accordance with the first or second gain value is performed in the case where after the user's data which has been recorded into a certain recording portion was erased, a quality of the recording portion from which the user's data was erased is checked.

* * * * *

UNITED STATES PATENT AND TRADEMARK OFFICE
CERTIFICATE OF CORRECTION

PATENT NO. : 5,124,967
DATED : June 23, 1992
INVENTOR(S) : Kazuo Isaka et al

It is certified that error appears in the above-indentified patent and that said Letters Patent is hereby corrected as shown below:

| Column | Line | |
|---|---|---|
| 1 | 42 | Change "enough" to --sufficiently--. |
| 1 | 54 | Change "guality" to --quality--. |
| 1 | 55 | Change "guaranteed" to --unnecessarily maintained--. |
| 2 | 30 | Change "decreased" to --decreases--. |
| 2 | 39 | Change "creased" to --creases--. |
| 2 | 53 | Change "a dust is adhered onto" to --dust adheres to--. |
| 6 | 64 | Change "($\|6a-5a\|2$)" to --($\|6a-5a\| \leq 2$)--. |
| 7 | 4 | Change "decreased" to --decreases--. |
| 7 | 33 | Change "are" to --is--. |
| 7 | 65 | Change "decreased" to --decreases--. |

UNITED STATES PATENT AND TRADEMARK OFFICE
CERTIFICATE OF CORRECTION

PATENT NO. : 5,124,967
DATED : June 23, 1992
INVENTOR(S) : Kazuo Isaka et al

Page 2 of 2

It is certified that error appears in the above-indentified patent and that said Letters Patent is hereby corrected as shown below:

| Column | Line | |
|---|---|---|
| 7 | 67 | Change "could not" to --cannot--; change "failed" to --fails--. |
| 8 | 12 | Change "enough" to --sufficiently--. |
| 8 | 57 | After "As" insert --a--; delete "another". |
| 8 | 59 | Change "by" to --with--. |
| 12 | 1 | Before "newly" change "in" to --is--. |

Signed and Sealed this

Seventh Day of December, 1993

Attest:

BRUCE LEHMAN

*Attesting Officer*         Commissioner of Patents and Trademarks